United States Patent
Goto

(10) Patent No.: US 6,521,500 B1
(45) Date of Patent: Feb. 18, 2003

(54) SEMICONDUCTOR DEVICE AND METHOD OF MANUFACTURING THE SAME

(75) Inventor: Yoshiro Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 144 days.

(21) Appl. No.: 09/605,740

(22) Filed: Jun. 29, 2000

(30) Foreign Application Priority Data

Jun. 30, 1999 (JP) .......................................... 11-185245

(51) Int. Cl.[7] .............................................. H01L 21/366
(52) U.S. Cl. ...................... 438/299; 438/197; 438/301; 438/303; 438/305; 438/306; 438/307
(58) Field of Search ................................ 438/197, 299, 438/305, 306, 307, 301, 303

(56) References Cited

U.S. PATENT DOCUMENTS

| | | | |
|---|---|---|---|
| 5,268,317 A | * 12/1993 | Schwalke et al. | 257/288 |
| 5,498,555 A | 3/1996 | Lin | |
| 5,766,969 A | * 6/1998 | Fulford et al. | 438/305 |
| 5,776,822 A | * 7/1998 | Fujii et al. | 438/586 |
| 5,966,606 A | * 10/1999 | Ono | 438/303 |
| 6,017,823 A | * 1/2000 | Shishiguchi et al. | 438/230 |
| 6,110,833 A | * 8/2000 | Early et al. | 438/700 |

FOREIGN PATENT DOCUMENTS

| | | |
|---|---|---|
| JP | 62-241379 | 10/1987 |
| JP | 4-58566 | 2/1992 |
| JP | 7-335875 | 12/1995 |

* cited by examiner

*Primary Examiner*—Matthew Smith
*Assistant Examiner*—V. Yevsikov
(74) *Attorney, Agent, or Firm*—Young & Thompson

(57) ABSTRACT

A thermal oxide film is formed on a silicon substrate, a polysilicon film is formed on the thermal oxide film, and further a patterned photoresist film is formed on the polysilicon. The polysilicon film and the thermal oxide film are etched using the photoresist film as a mask so as to form a gate electrode and a gate oxide film. The photoresist film is removed therefrom, and a thermal oxide film is formed in the circumference of the gate electrode, thereby to restore a constriction formed in the gate oxide film. A part of the thermal oxide film which corresponds to the gate electrode and another part thereof which corresponds to the semiconductor substrate are removed therefrom, and a side wall nitride film which adhere to the silicon substrate is formed on a side wall of the gate electrode. Thereafter, a source and drain diffusion layers corresponding to the gate electrode are formed on the silicon substrate, thereby to form metal wiring.

8 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly, to a semiconductor device including a gate oxide film without any constriction and a method of manufacturing the same.

2. Description of the Related Art

A method of manufacturing an n-channel type MOS transistor (hereinafter referred to as an nMOS transistor) will now be explained as an example of a conventional semiconductor device.

A thermal oxide film is formed on a p-type silicon substrate, and a polysilicon film is formed on the thermal oxide film. The polysilicon film and the thermal oxide film are patterned using a photoresist film, thereby to form a gate electrode and a gate oxide film. After this, the photoresist film is removed therefrom. Then, ions are implanted into the surface of the silicon substrate so as to form n-type diffusion layers. Subsequently, a side wall is formed on the side wall of the gate electrode. Ions are implanted into the surface of the silicon substrate while using the gate electrode and the side wall as masks, so as to form $n^+$-type diffusion layers for forming a source and drain areas. Heat treatment is carried out so as to activate the impurities, so that a source and drain diffusion layers each comprising the n-type diffusion layer and the $n^+$-type diffusion layer can be formed. Then, the gate electrode and the $n^+$-type diffusion layers are silicided, and an interlayer insulating film is formed on the silicon substrate. Furthermore, contact holes are formed in the interlayer insulating film, and wiring is formed on the $n^+$-type diffusion layers.

According to the above method of manufacturing the semiconductor device, the gate oxide film is exposed to a removing agent when removing the photoresist film, and exposed to a cleaning agent when cleaning the silicon substrate. This causes a constriction (hollow) to be formed in the gate oxide film. If there is any constriction in the gate oxide film, an oxide film formed on the silicon substrate enters the constriction when forming a side wall. In the semiconductor device having such a defective gate oxide film, unnecessary current flows through the gate oxide film when an electric field is applied between the gate electrode and the substrate, resulting in breaking down the gate oxide film.

After the formation of the gate electrode, having formed a thick thermal oxide film, the constriction can be filled with an oxide, etc., and thus restoring the gate oxide film. In order to prevent the restored gate oxide film from being exposed to the release agent for photoresist film or the cleaning agent for silicon substrate during a process following this process of restoring the gate oxide film, it is necessary to remain the thick thermal oxide film on the silicon substrate. In this case, in the state where the thermal oxide film is formed both on a source and drain electrode areas, an ion implantation process is carried out, thus it is difficult to manufacture a semiconductor device in which a pn-junction is formed not far from the surface of the substrate.

Unexamined Japanese Patent Application KOKAI Publication No. S62-241379 discloses a method of manufacturing a semiconductor device, wherein, after the formation of a gate electrode using a photoresist film, a nitride film is formed on the side wall of a gate electrode and the photoresist film is removed therefrom. According to this method, an ion implantation process is carried out in the state where an insulating film is formed both on a source and drain electrode areas, therefore, it is difficult to form the semiconductor device wherein the pn-junction is formed not far from the surface of the substrate.

Unexamined Japanese Patent Application KOKAI Publication No. H4-58566 discloses a method of manufacturing a semiconductor device, wherein, after the formation of a gate electrode, an oxide film is formed on the side wall of the gate electrode. The thickness of the oxide film to be formed on the side wall of the gate electrode is 30 to 100 nm, i.e., it is quite thick. Thus, it is difficult to diffuse an impurity diffusion layer into the lower end of the gate electrode through heat treatment.

It is accordingly an object of the present invention to provide a semiconductor device having a gate insulating film with high reliability and a method of manufacturing the same.

Another object thereof is to provide a semiconductor device, wherein a pn-junction is formed not far from the surface of a substrate, and a method of manufacturing the same.

SUMMARY OF THE INVENTION

In order to achieve the above objects, according to the first aspect of the present invention, there is provided a method of manufacturing a semiconductor device, comprising:

forming a first insulating film on a semiconductor substrate;

forming a conductive film on the first insulating film;

forming an etching mask with a predetermined pattern on the conductive film;

etching the conductive film using the etching mask, so as to form a gate electrode;

removing the etching mask with a removing agent;

forming a second insulating film, with which a constriction formed in the first insulating film by the removing agent is filled and which is incorporated with the first insulating film, on a circumference of the gate electrode;

forming a gate insulating film which insulates between the gate electrode and the semiconductor substrate, by removing the first insulating film using the gate electrode and the second insulating film as masks;

forming a protection film which covers at least a circumference of the gate insulating film, in order to protect the gate insulating film during a step following this step; and implanting an impurity into the semiconductor substrate using the gate electrode, the second insulating film and the protection film as masks, and forming a source area and a drain area by performing heat treatment.

According to the above method, after the removing of the etching mask with the removing agent, having formed the second insulating film which is incorporated with the first insulating film, the constriction (hollow) made in the first insulating film by the removing agent can be filled. Accordingly, the gate insulating film without any constriction can be formed.

Having formed the protection film in the circumferential section of the restored gate oxide film, it becomes preventable that the gate oxide film is exposed to a chemical agent during a process for removing the etching mask or a process for cleaning the substrate, for example. This prevents any new constriction from being formed. Therefore, a semiconductor device having a gate oxide film with high reliability can be manufactured.

The forming the gate insulating film may include removing the first insulating film and a part of the second insulating film which corresponds to an upper surface of the gate electrode; and the forming the protection film may include forming the protection film as to cover the first and second insulating films, and the method may comprise:

removing a part of the protection film which corresponds to the upper surface of the gate electrode, thereby to expose the upper surface of the gate electrode; and forming a silicide layer on the upper surface of the gate electrode.

After the formation of the second insulating film, the second insulating film formed on the upper surface of the gate electrode is removed therefrom. After the formation of the protection film, the protection film is removed from the upper surface of the gate electrode. By doing this, the upper surface of the gate electrode is exposed, and a silicide layer is formed on the gate electrode, resulting in siliciding the gate electrode.

In the method of manufacturing a semiconductor device, the semiconductor substrate may be a silicon substrate;

the first insulating film and the second insulating film may be thermal oxide films;

the conductive film may be a polysilicon film;

the etching mask may be a photoresist pattern;

the removing agent may be a removing agent for photoresist, by which agent the thermal oxide film is unwantedly etched; and the protection film may be a nitride film which is hardly removed by the removing agent for photoresist, as compared to the thermal oxide film.

In the case of manufacturing a semiconductor device using the above elements, the gate insulating film, which includes the thermal oxide film formed on the silicon substrate, and the thermal oxide film, which is formed on the surface of the gate electrode formed of polysilicon, can easily be incorporated with each other.

The nitride film can be etched at a higher etching rate than that for the thermal oxide film. Thus, even if the nitride film is exposed to the removing agent for photoresist or the cleaning agent for silicon substrate, it is not hardly etched. This achieves sufficient protection of the gate insulating film.

The removing agent for photoresist may be a mixture of $NH_4OH$ and $H_2O_2$.

The method of manufacturing a semiconductor device, may comprise:

forming a first diffusion area by implanting an impurity into the semiconductor substrate at a first concentration and a first energy level, through utilization of the gate electrode, the second insulating film and the protection film as masks;

cleaning the semiconductor substrate using a cleaning agent, while protecting the second insulating film with the protection film;

forming a side wall film on the protection film;

implanting an impurity into the semiconductor substrate at a second concentration which is higher than the first concentration and at a second energy level higher than the first energy level, through utilization of the gate electrode, the second insulating film, the protection film and the side wall film as masks, thereby to form a second diffusion area at a high concentration which area overlaps with the first diffusion area, and which is formed in a deeper position than a position of the first diffusion area; and diffusing and activating an impurity inside the first and second diffusion area by heat treating the semiconductor substrate, and forming a source area and a drain area each of which includes a low concentration area reaching a lower end of the gate electrode and a high concentration area connected to the lower concentration area.

It is preferred that the second insulating film be formed to a thickness of 2.0 to 7.0 nm. In this case, a constriction (follow) formed in the first insulating film can be filled without any opening.

It is preferred that the protection film be formed to a thickness of 3.0 to 8.0 nm. In this case, the restored gate insulating film can reliably be protected during any following processes.

In order to accomplish the above objects, according to the second aspect of the present invention, there is provided a method of manufacturing a semiconductor device, comprising:

forming a well area of an opposite conductivity type to a conductivity type of a semiconductor substrate on a surface the semiconductor substrate;

forming a first and second gate insulating films respectively on the surface of the semiconductor substrate and a surface of the well area; forming a first gate electrode on the semiconductor substrate via the first insulating film, and a second gate electrode on the well area via the second gate insulating film;

forming a first and second protection films which respectively covers at least circumferences of the first and second gate insulating films;

forming a first diffusion area, by covering the well area with a first mask and implanting a first impurity into the semiconductor substrate through utilization of the first mask, the first gate electrode and the first protection film as masks;

removing the first mask with a removing agent while protecting the first and second gate insulating films respectively with the first and second protection films;

forming a second diffusion area, by covering the semiconductor substrate with a second mask and implanting a second impurity into the well area through utilization of the second mask, the second gate electrode and the second protection film as masks;

removing the second mask with a removing agent, while protecting the first and second gate insulating films respectively with the first and second protection films; and diffusing and activating an impurity inside the first and second diffusion areas by heat treating the semiconductor substrate, forming a first and second drain areas each including the first diffusion area reaching a lower end of the first gate electrode, and forming a second source and drain areas each including the second diffusion area reaching a lower end of the second gate electrode.

According to the above method, during the formation of a CMOS device, the gate insulating film formed in the NMOS transistor area or the pMOS transistor area can be protected by the protection film. According to this method, the gate insulating film can not be exposed to the removing agent during the process for removing the mask. Thus, the gate insulating film with high reliability can be formed.

In order to accomplish the above objects, according to the third aspect of the present invention, there is provided a semiconductor device comprising:

a semiconductor substrate;

a gate insulating film formed on the semiconductor substrate;

a gate electrode formed on the gate insulating film;

an insulating film which is formed around the gate electrode and incorporated with the gate insulating film;

a protection film which is formed at least a circumference of the gate insulating film;

a source area and a drain area which are formed on the semiconductor substrate and reach a lower end of the gate electrode.

The semiconductor device of the present invention may comprise:

a side wall which is formed on a periphery of the gate electrode as to cover the insulating film and the protection film; and the source and drain areas which are formed on a surface of the semiconductor substrate and both of which respectively include a low concentration area reaching the lower end of the gate electrode and a high concentration area connected to the lower concentration area.

In order to accomplish the above objects, according to the fourth aspect of the present invention, there is provided a semiconductor device comprising: a semiconductor substrate;

a well area which is formed on a surface of the semiconductor substrate and which is of an opposite conductivity type to a conductivity type of the semiconductor substrate;

a first and second gate insulating films which are respectively formed on the surface of the semiconductor substrate and on a surface of the well area;

a first gate electrode which is formed on the semiconductor substrate via the first gate insulating film;

a second gate electrode which is formed on the well area via the second gate insulating film;

a first and second protection films which respectively cover at least circumference of the first and second gate insulating films;

a first source and drain areas each of which includes a first diffusion area and each of which is formed on the surface of the semiconductor substrate; and a second source and drain areas each of which includes a second diffusion area and each of which is formed on the surface of the well area.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

Figure 1:
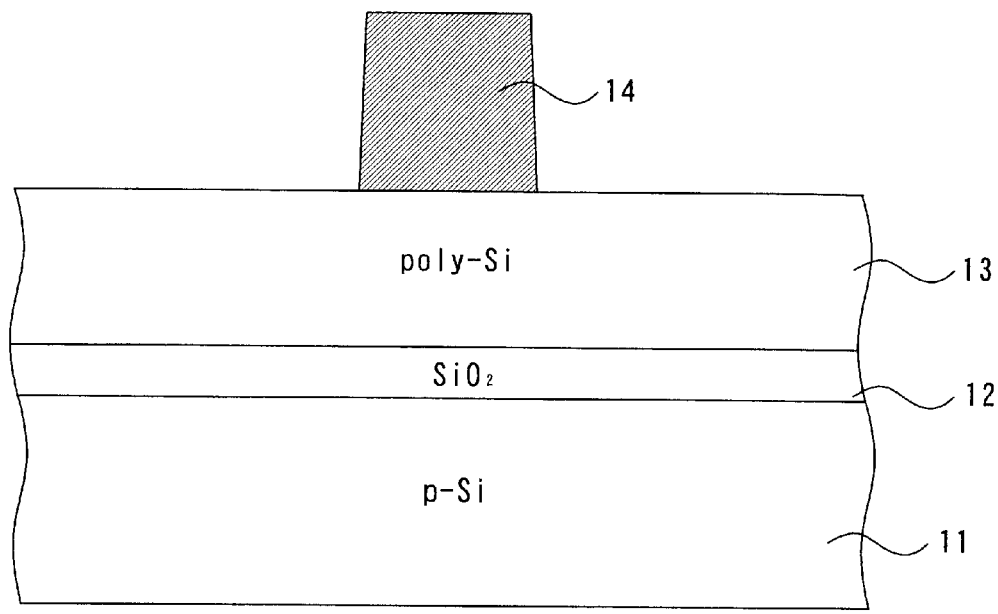
FIG. 1 is a cross section showing a process for manufacturing a semiconductor device according to the first embodiment of the present invention.

Preferred embodiments of the present invention will now be explained with reference to the accompanying drawings.

(First Embodiment)

A semiconductor device according to the first embodiment has the structure of an nMOS transistor comprising: a p-type silicon substrate 11; a source and drain diffusion layers each including an $n^-$-type diffusion layer 23 and an $n^+$-type diffusion layer 25 both of which are formed on the surface of the silicon substrate 11; and a gate electrode 15 formed on the silicon substrate 11. A gate oxide film 16 is formed between the silicon substrate 11 and the gate electrode 15, while a side wall 24 is formed adjacent to the side walls of respective the gate electrode 15 and gate oxide film 16 via a side wall protection film 22. The side wall protection film 22 includes a side wall oxide film 19 and a side wall nitride film 21. A plurality of $CoSi_2$ films 26 are formed respectively on the $n^+$-type diffusion layers 23 and the gate electrode 15, while metal wiring 29 are formed respectively above the $n^+$-type diffusion layers 25.

A method of manufacturing the semiconductor device according to the first embodiment will now be explained.

As illustrated in FIG. 1, a thermal oxide film 12 which is approximately 4.0 nm in thickness is formed on the silicon substrate 11 with a thermal oxidation technique. A polysilicon film 13 which is approximately 150 nm in thickness is formed on the thermal oxide film 12. Moreover, a photoresist film 14 is formed on the polysilicon film 13 with a lithography technique.

Figure 2:
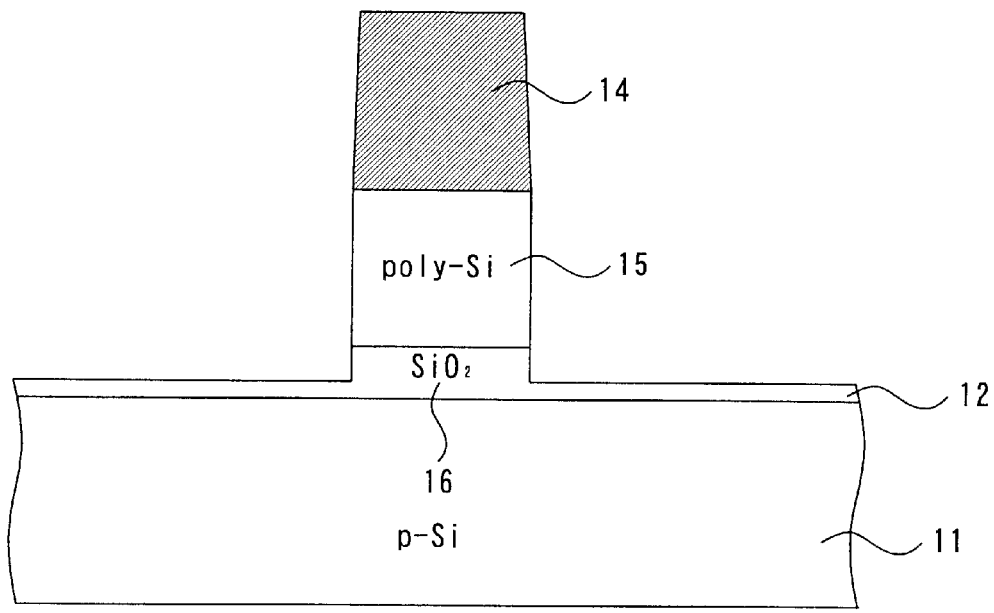
FIG. 2 is a cross section showing a process for manufacturing the semiconductor device according to the first embodiment of the present invention.

As described in FIG. 2, the polysilicon film 13 is etched using an anisotropy etching technique so as to form a gate electrode 15, whose width is approximately 0.15 μm, using the photoresist film 14 as a mask. At this time, a part of the polysilicon film 13 which is not covered by the photoresist film 14 on top is removed, thus the thermal oxide film 12 is etched while remaining the thickness of approximately 1.0 to 4.0 nm (i.e., over etching the polysilicon film 13). By doing this, the gate oxide film 16 is formed between the gate electrode 15 and the silicon substrate 11.

Figure 3:
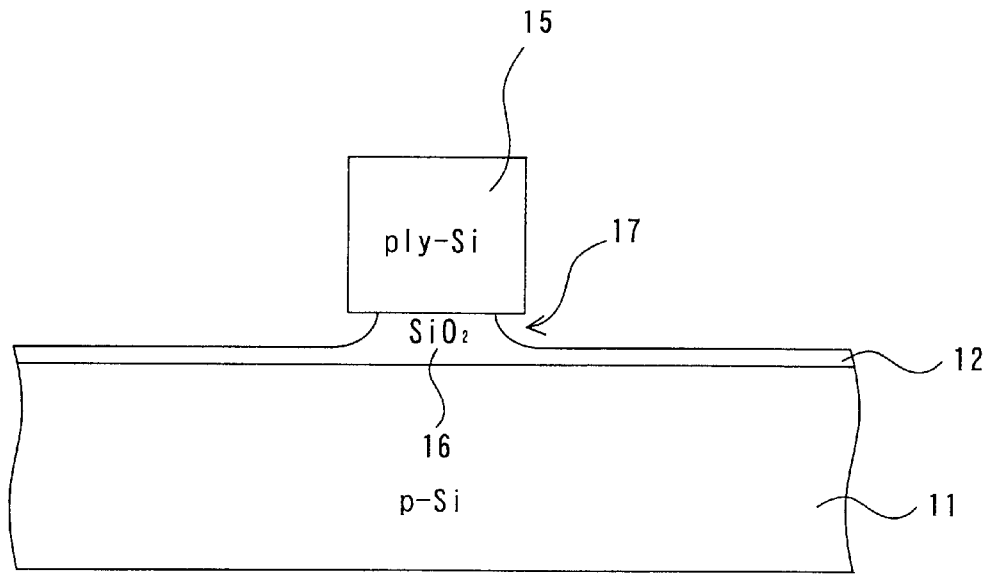
FIG. 3 is a cross section showing a process for manufacturing the semiconductor device according to the first embodiment of the present invention.

As described in FIG. 3, the photoresist film 14 is removed using a mixture (a release agent) of $NH_4OH$ (ammonium hydroxide) and $H_2O_2$ (hydrogen peroxide). In this process, the thermal oxide film 12 and the gate oxide film 16 are etched to the thickness of approximately 0.5 to 1.0 nm. This brings a constriction (hollow) 17 in the gate oxide film 16.

Figure 4:
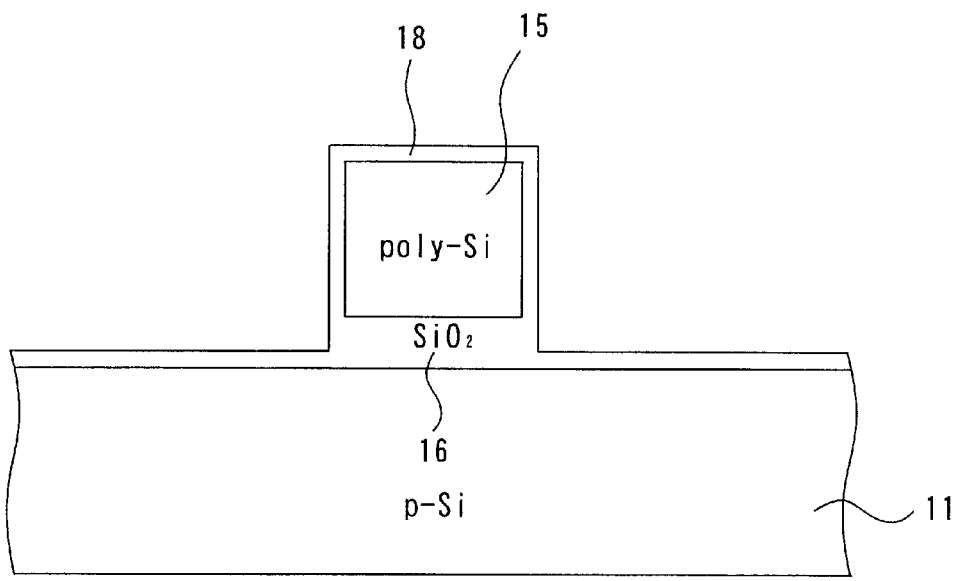
FIG. 4 is a cross section showing a process for manufacturing the semiconductor device according to the first embodiment of the present invention.

In order to fix the constriction 17, as described in FIG. 4, the oxide film 18 is formed as to surround the gate electrode 15, with a thermal oxidation technique. At this time, the oxide film 18 is formed in such a way that the thickness thereof is about 2.0 to 7.0 nm, so that the gate oxide film 16 is incorporated with the oxide film 18. In doing this, the constriction 17 is filled with the oxide film 18, and the gate oxide film 16 and the oxide film 18 are incorporated with each other.

Figure 5:
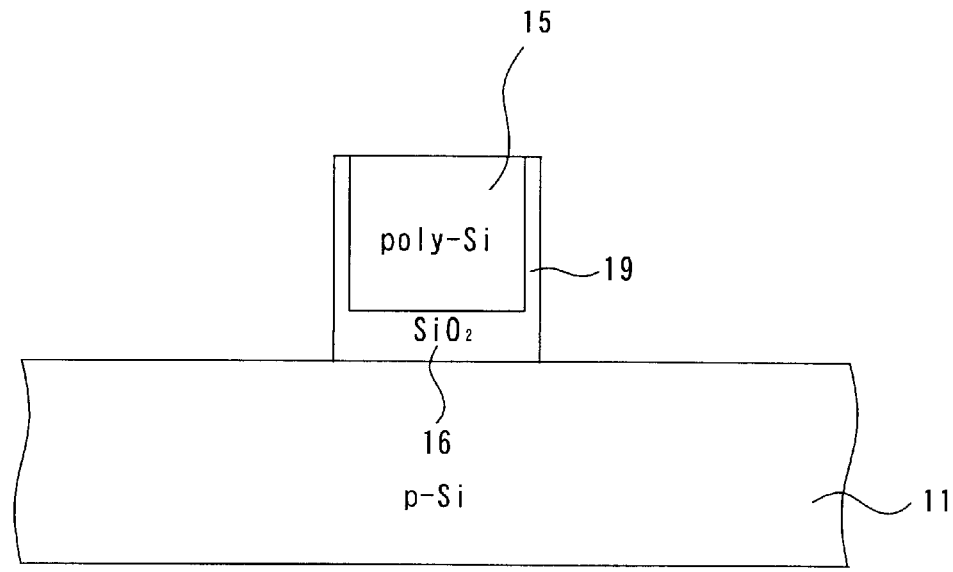
FIG. 5 is a cross section showing a process for manufacturing the semiconductor device according to the first embodiment of the present invention.

As described in FIG. 5, the thermal oxide film 12 above the silicon substrate 11 and the oxide film 18 covering the top surface of the gate electrode 15 are etched and removed therefrom with an anisotropy etching technique, while using the gate electrode 15 and the oxide film 18 covering the side wall of the gate electrode 15 as masks. By doing this, the side wall oxide film 19 is formed on the side wall of the gate electrode 15.

Figure 6:
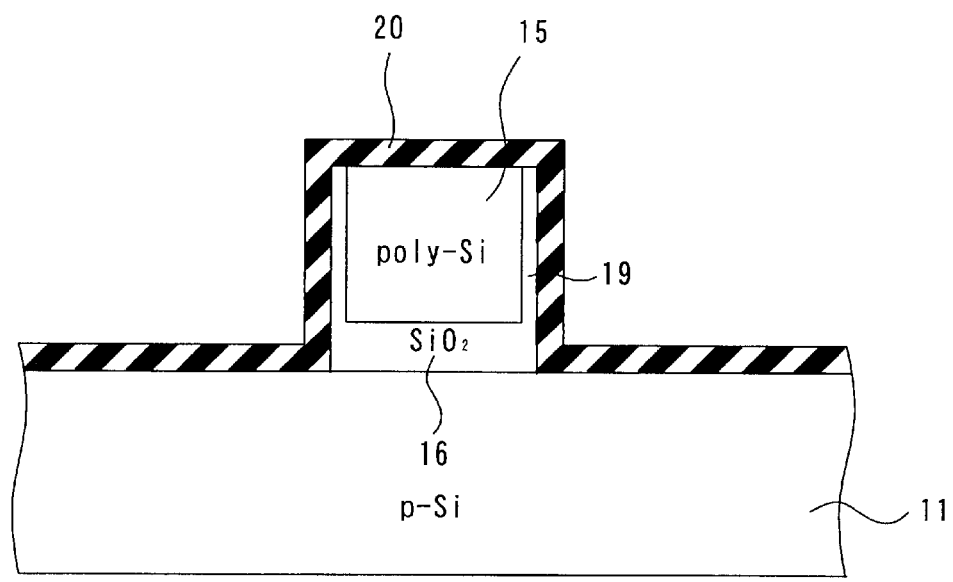
FIG. 6 is a cross section showing a process for manufacturing the semiconductor device according to the first embodiment of the present invention.

Subsequently, as illustrated in FIG. 6, a nitride film 20 which is 3.0 to 8.0 nm in thickness is formed on the silicon substrate 11 with a CVD (Chemical Vapor Deposition) technique.

Figure 7:
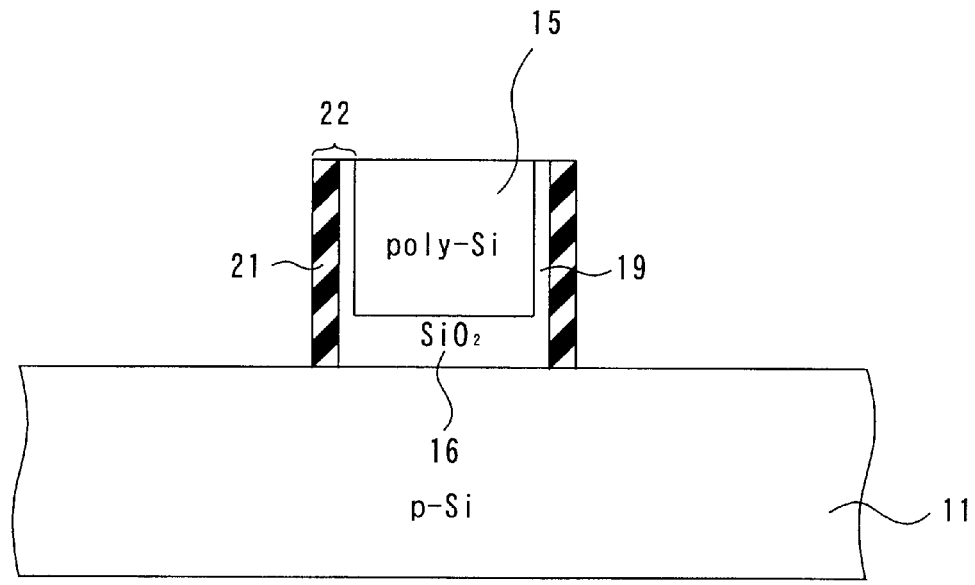
FIG. 7 is a cross section showing a process for manufacturing the semiconductor device according to the first embodiment of the present invention.

Then, as described in FIG. 7, the nitride film 20 covering the top surface of the gate electrode 15 and the silicon substrate 11 is etched and removed therefrom with an anisotropy etching technique, so as to form the side wall nitride film 21 whose lower end is in contact with the surface of the silicon substrate 11. Accordingly, formed on the side wall of the gate electrode 15 is the side wall protection film 22 which includes the side wall oxide film 19 and the side wall nitride film 21 and which is 0.5 to 1.5 nm in thickness.

Figure 8:
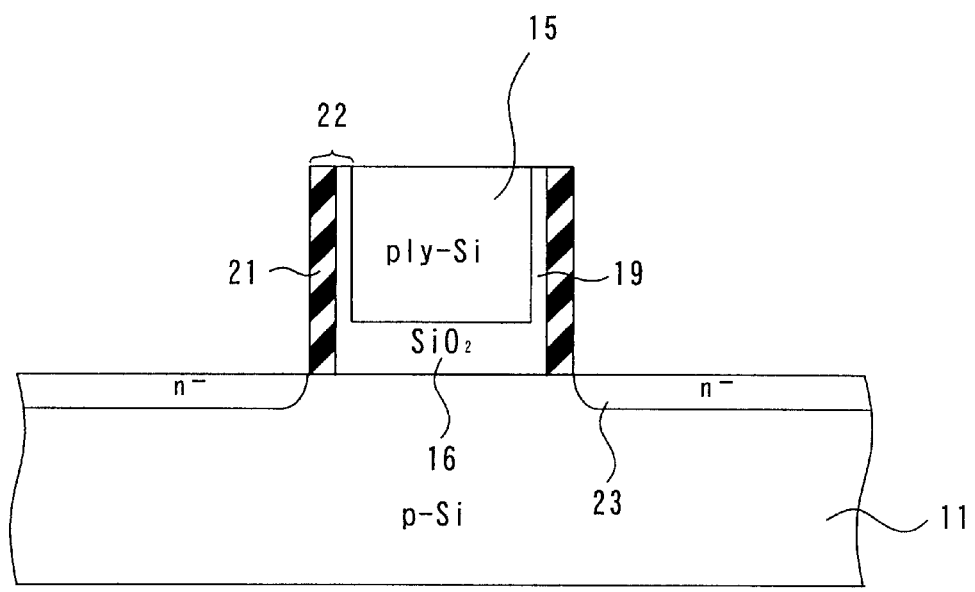
FIG. 8 is a cross section showing a process for manufacturing the semiconductor device according to the first embodiment of the present invention.

As illustrated in FIG. 8, the $n^-$-type diffusion layers 23 are formed on the surface of the silicon substrate 11, while using the gate electrode 15 and the side wall protection film 22 as masks, through the use of the ion implantation process. In particular, As (arsenic) is implanted thereinto at an energy level of 5 keV and with an implantation amount of 5E14 $cm^{-2}$, for example.

Thereafter, the silicon substrate 11 is cleaned using the mixture (cleaning agent) of $NH_4OH$ and $H_2O_2$. By doing this, the thermal oxide film 12 which covers the $n^-$-type diffusion layers 23 is completely removed therefrom. It should be noted that an etching rate at which the side wall nitride film 21 is etched using the mixture of $NH_4OH$ and $H_2O_2$ is equal to or lower than half of an etching rate at which the thermal oxide film 12 is etched. Thus, the side wall nitride film 21 can reliably protect the gate oxide film 16 from the cleaning agent.

Figure 9:
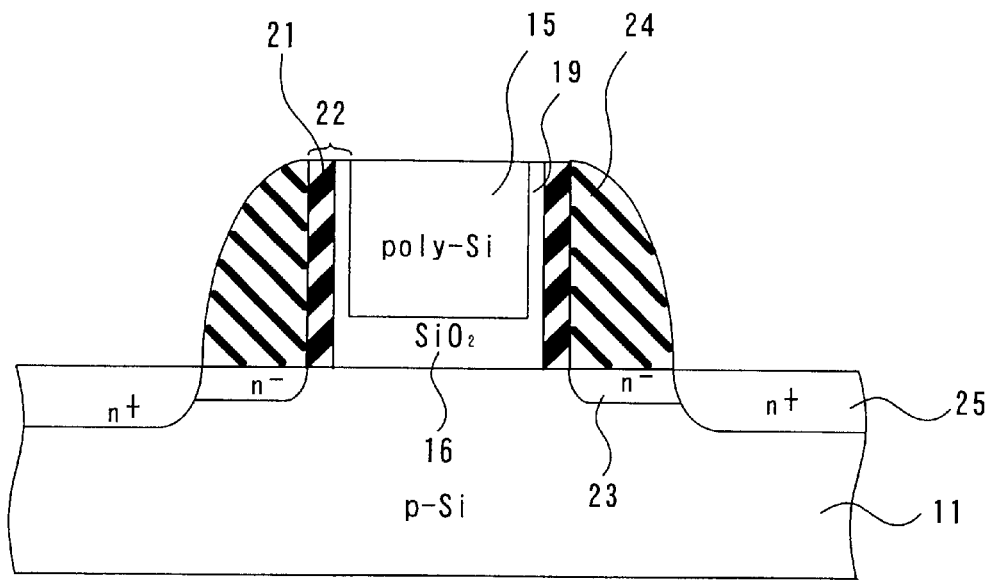
FIG. 9 is a cross section showing a process for manufacturing the semiconductor device according to the first embodiment of the present invention.

After the cleaning of the silicon substrate 11, an oxide film which is about 100 nm in thickness is formed on the entire surface of the silicon substrate 11 with the CVD technique. Then, this oxide film is etched with the anisotropy etching technique, so that a side wall 24 is formed on the side wall of the side wall nitride film 21, as described in FIG. 9. The high-concentration $n^-$-type diffusion layers 25 are formed on the surface of the silicon substrate 11, while using the gate electrode 15, the side wall protection film 22 and the side wall 24 as masks, through the use of the ion implantation process. In particular, As (arsenic) is implanted thereinto at an energy level of 50 keV and with an implantation amount of 5E15 $cm^{-2}$, for example.

For the purpose of activating the impurities implanted into the $n^-$-type diffusion layers 23 and the $n^+$-type diffusion layers 25, heat treatment is carried out at a temperature of 1050° C. for 20 minutes. Then, the $n^-$-type diffusion layers 23 and the $n^+$-type diffusion layers 25 become larger both in a depth and lengthwise directions, and one ends of the respective $n^-$-type diffusion layers 23 reach the lower end of the gate electrode 15. The distance between the gate electrode 15 and each of the $n^-$-type diffusion layers 23 is approximately in a range between 0.5 and 1.5 nm (corresponding to the thickness of the side wall protection films 22). Accordingly, the $n^-$-type diffusion layers 23 can sufficiently reach the lower end of the gate electrode 15. The heat treatment is carried out at the high temperature for a short period of time. Therefore, the $n^-$-type diffusion layers 23 and the $n^+$-type diffusion layers 25 are unlikely to become larger in their depth direction, resulting in forming the source and drain diffusion layers each containing a pn-junction which is formed not far from the surface of the silicon substrate 11.

Figure 10:
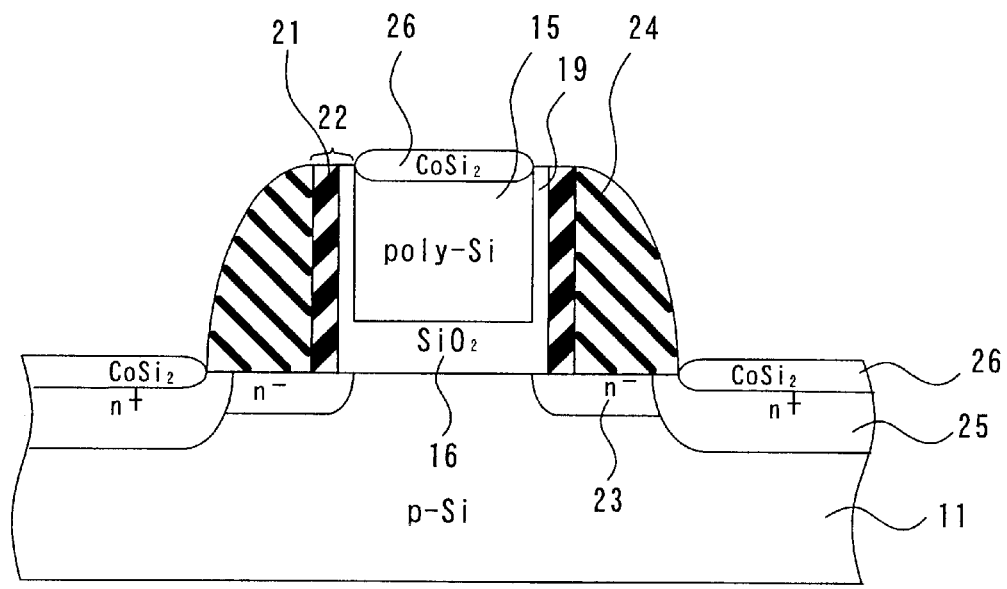
FIG. 10 is a cross section showing a process for manufacturing the semiconductor device according to the first embodiment of the present invention.

In order to silicide the surface of the silicon substrate 11, Co (cobalt) is deposited to a thickness of 10 to 15 nm on the entire surface of the silicon substrate 11 with a sputtering technique. Subsequently, heat treatment is carried out so as to make Co and Si (silicon) undergo a chemical reaction with each other. As described in FIG. 10, $CoSi_2$ films 26 are formed respectively on the gate electrode 15 and the $n^+$-type diffusion layers 25, and any Co which has not undergone the chemical reaction with Si is removed therefrom.

Figure 11:
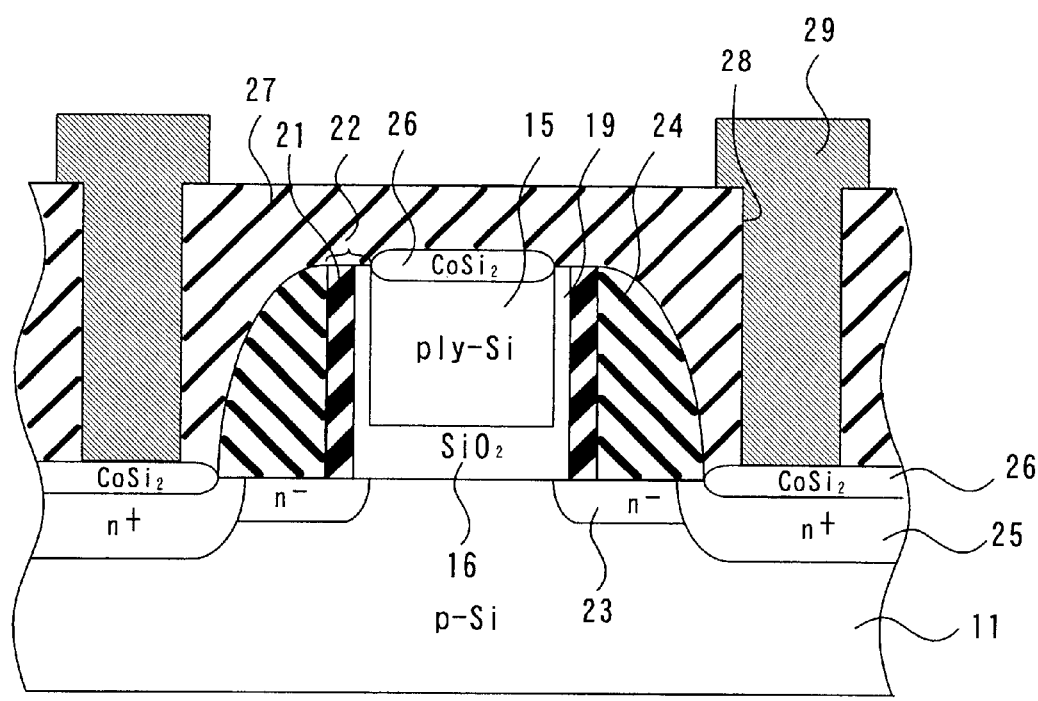
FIG. 11 is a cross section of the semiconductor device according to the first embodiment of the present invention.

After the formation of the $CoSi_2$ films 26, as illustrated in FIG. 11, an interlayer insulating film 27 is formed on the entire surface of the silicon substrate 11, and contact holes 28 are formed in the interlayer insulating film 27. Further, a metal film is formed on the interlayer insulating film 27 and patterned, resulting in forming metal wiring 29.

As explained above, having formed the side wall oxide film 19, the constriction 17 in the gate oxide film 16 can be restored. In addition, having formed a side wall nitride film 21 on the side walls of the respective gate electrode 15 and the gate oxide film 16, it becomes preventable that the gate oxide film 16 is corroded by the cleaning agent. Accordingly, the gate oxide film 16 with high reliability can be formed.

It should be mentioned that the side wall nitride film 21 is formed only on the side walls of the gate electrode 15 and the gate oxide film 16, so that it does not remain on a part of the silicon substrate 11 where a source and drain electrodes are to be formed. Hence, the implantation of impurities can be performed at a sufficiently low energy level. Accordingly, those semiconductor devices, wherein the pn-junction is formed not far from the surface of the substrate, can be manufactured. In the structure where the pn-junction is formed not far from the surface, a punch-through can be prevented from occurring. Therefore, the width of the gate electrode can be made small.

Having formed the side wall protection film 22, the distance between the gate electrode 15 and the $n^+$-type diffusion layers 25 become long, thus no punch-through is likely to occur.

(Second Embodiment)

In the first embodiment, the explanations have been made to the nMOS transistor. However, the present invention is not limited to the nMOS transistor, and can be employed for any pMOS transistor or CMOS transistor. In the first embodiment, the side wall 24 has been formed, however, the present invention can be adapted to semiconductor devices in which no side wall is formed.

A semiconductor device according to the second embodiment of the present invention, wherein a CMOS device is employed, will now be described.

Figure 15:
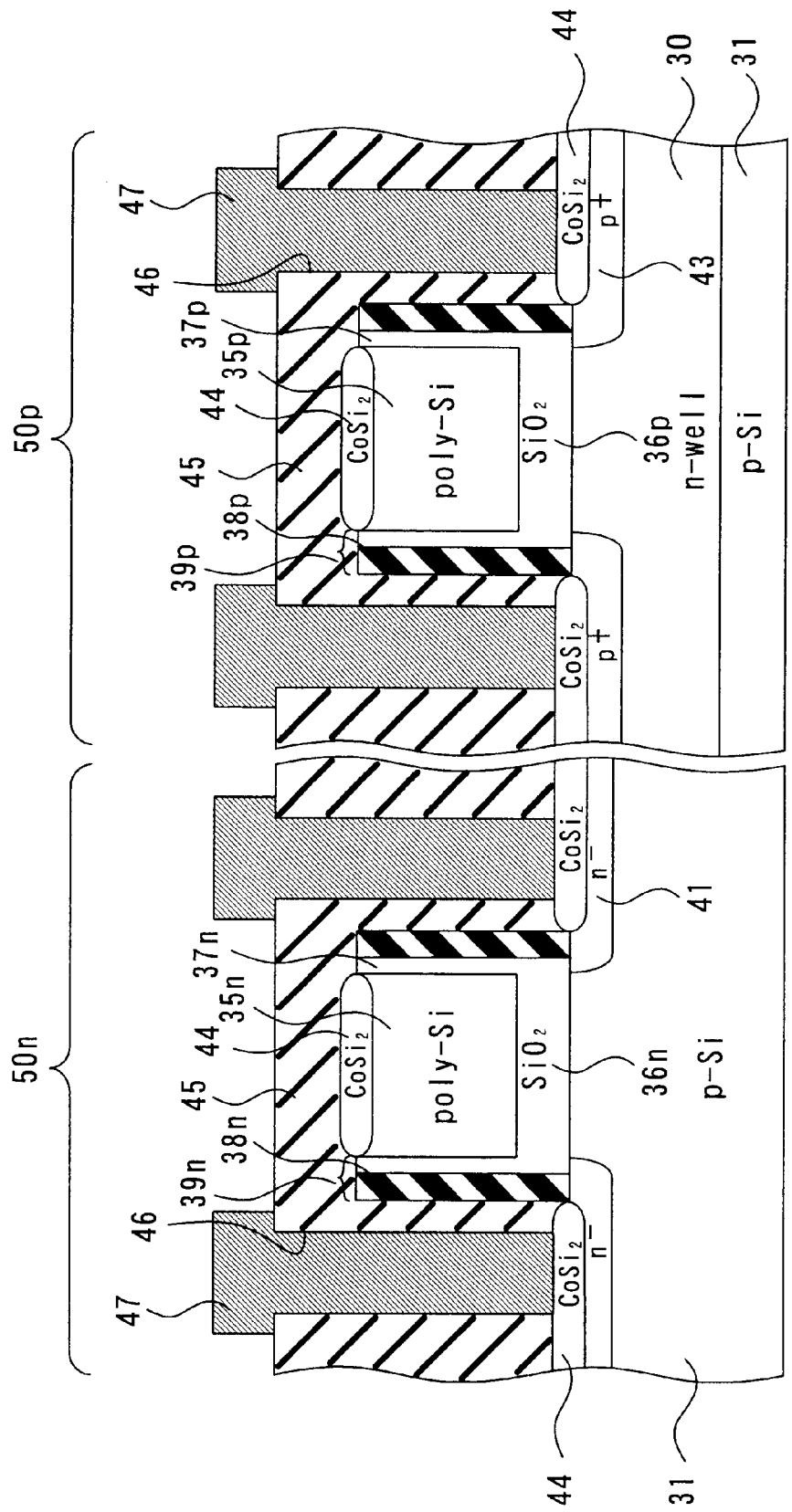
FIG. 15 is a cross section showing the semiconductor device according to the second embodiment of the present invention.

The semiconductor device according to the second embodiment comprises an nMOS transistor area 50n and a pMOS transistor area 50p, as illustrated in FIG. 15. The nMOS transistor area 50n includes a source and drain diffusion layers each including an n$^-$-type diffusion layer 41 which is formed on the surface of a p-type silicon substrate 31. The pMOS transistor area 50p includes a source and drain diffusion layers each including a p$^+$-type diffusion layer 43 formed in an n-well 30. In the respective nMOS transistor area 50n and the pMOS transistor area 50p, gate oxide films 36n and 36p are formed respectively between the silicon substrate 31 and a gate electrode 35n and between the silicon substrate 31 and the gate electrode 35p. Further, side wall protection films 39n and 39p are formed on the side walls of the gate electrode 35n and the gate oxide film 36n, and the gate electrode 36p and the gate oxide film 36p, respectively. The side wall protection films 39n and 39p are respectively composed of side wall oxide films 37n and 37p, and side wall nitride films 38n and 38p. A plurality of CoSi$_2$ films 44 are formed all over the gate electrodes 35n, 35p, and the n$^-$-type diffusion layers 41 and the p$^+$-type diffusion layers 43. Metal wiring 47 are formed respectively on the n$^-$-type diffusion layers 41 and the p$^+$-type diffusion layers 43.

A method of manufacturing the semiconductor device according to the second embodiment of the present invention will now be explained.

The n-well 30 is formed on the p-type silicon substrate 31 in the pMOS transistor area 50p. After this, until the formation of the side wall protection films 39n and 39p, the manufacturing processes are carried out likewise in the first embodiment.

Figure 12:
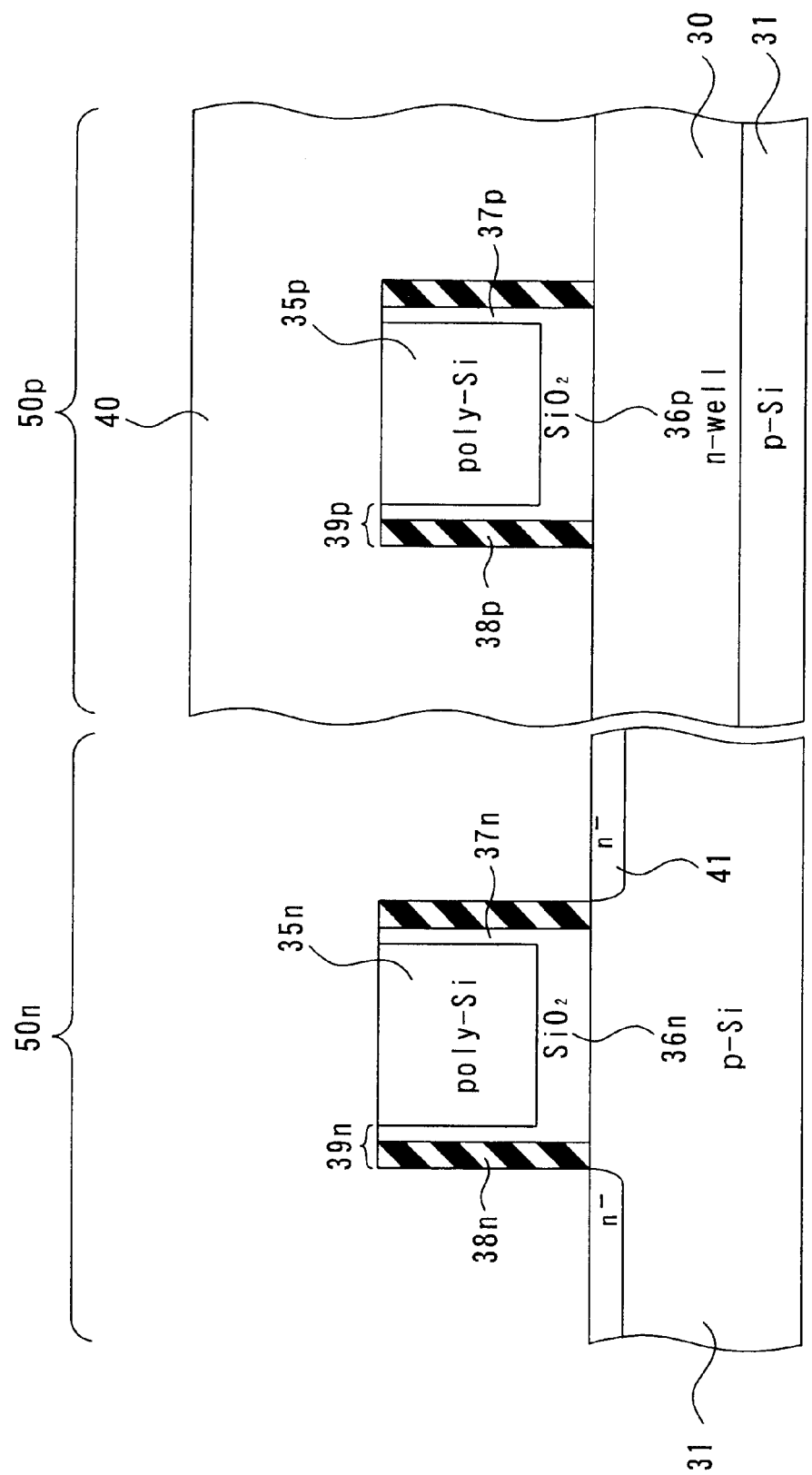
FIG. 12 is a cross section showing a process for manufacturing a semiconductor device according to the second embodiment of the present invention.

As described in FIG. 12, the pMOS transistor area 50p is covered by a photoresist film 40, and As (arsenic) is implanted into the nMOS transistor area 50n through the use of the ion implantation process, thereby to form the n-type diffusion layers 41. Then, the photoresist film 40 is removed therefrom using a mixture (a release agent) of NH$_4$OH and H$_2$O$_2$. At this time, the gate oxide films 36n and 36p are so protected respectively by the side wall nitride films 38n and 38p that they are not likely to be corroded by the release agent.

Figure 13:
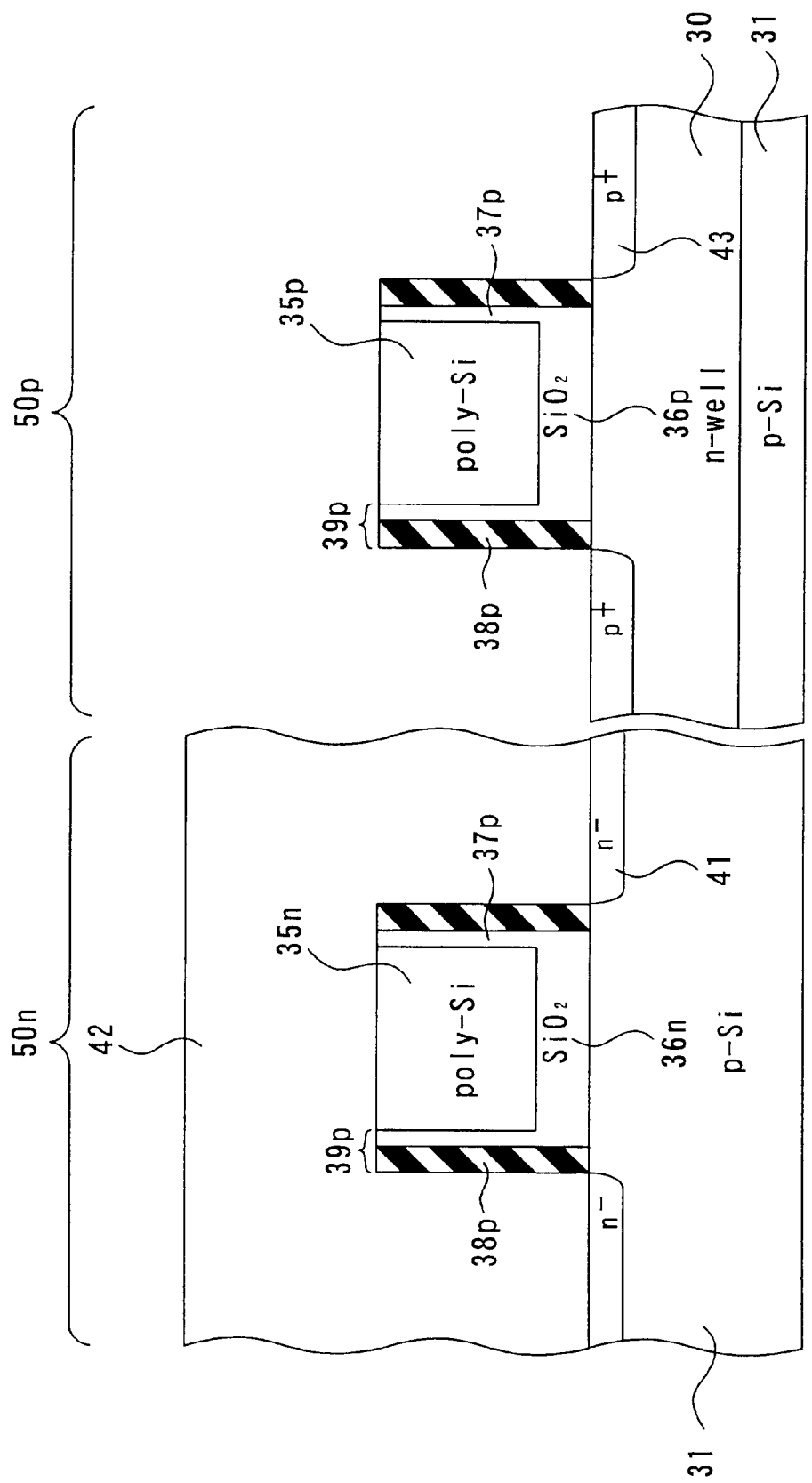
FIG. 13 is a cross section showing a process for manufacturing the semiconductor device according to the second embodiment of the present invention.

Subsequently, as illustrated in FIG. 13, the nMOS transistor 50n is covered by a photoresist film 42, and B (boron) is implanted into the pMOS transistor area 50p through the use of the ion implantation process, thereby to form the p$^+$-type diffusion layers 43. After this, the photoresist film 42 is removed therefrom.

In order to activate the impurities in the n$^+$-type diffusion layers 41 and p$^+$-type diffusion layers 43, heat treatment process is carried out at a high temperature for a short period of time. By doing this, the n-type diffusion layers 41 and p$^+$-type diffusion layers 43 become larger both in depth and lengthwise directions. One ends of the respective n-type diffusion layers 41 reach the lower end of the gate electrode 35n, while one of the p$^+$-type diffusion layers 43 reaches the lower end of the gate electrode 35p.

Figure 14:
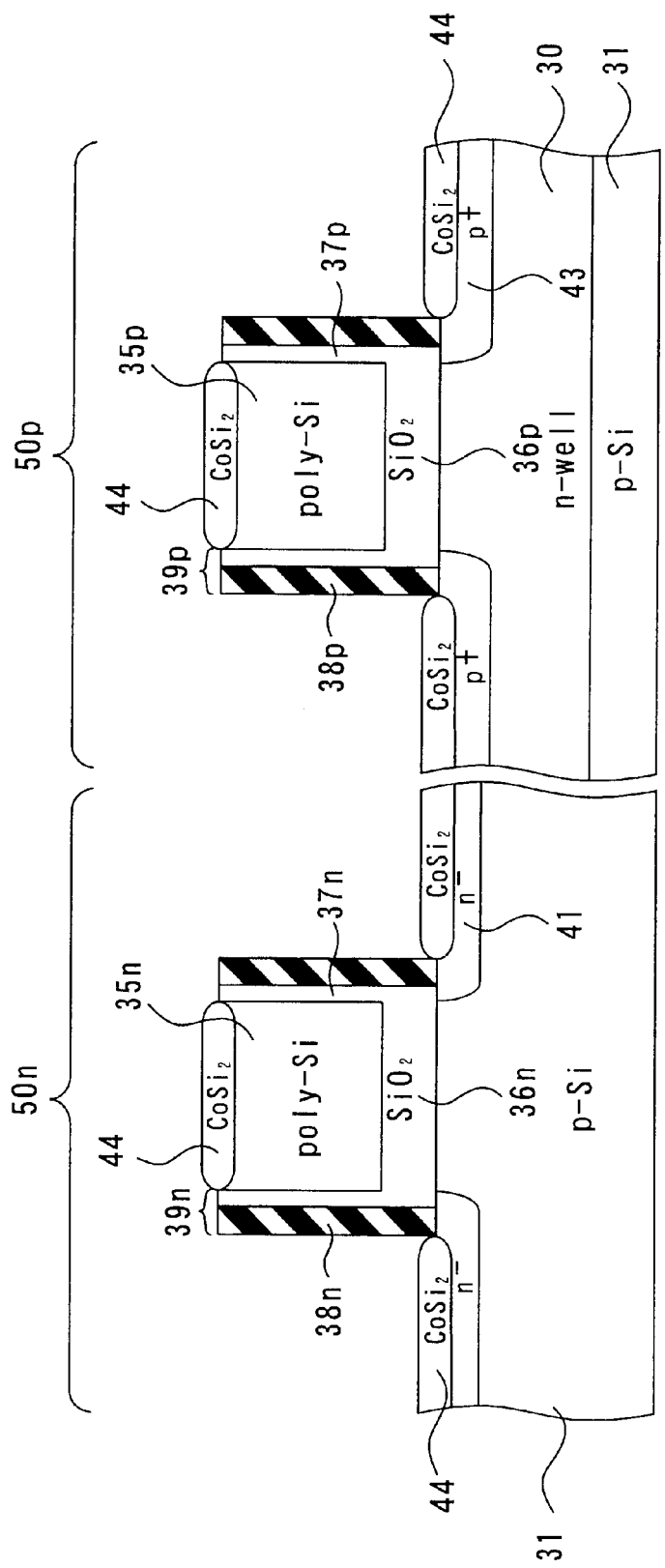
FIG. 14 is a cross section showing a process for manufacturing the semiconductor device according to the second embodiment of the present invention.

In order to silicide the surface of the silicon substrate 31, Co is deposited into a thickness of 10 to 15 nm on the entire surface of the silicon substrate 31, using a sputtering technique. Then, heat treatment is carried out so as to make Co and Si (silicon) undergo a chemical reaction with each other. As described in FIG. 14, CoSi$_2$ films 44 are formed respectively on the gate electrodes 35n and 35p, and on the n$^-$-type diffusion layers 41 and the p$^+$-type diffusion layers 43, and any Co which has not undergone the chemical reaction is removed therefrom.

After the formation of the CoSi$_2$ films 44, as described in FIG. 15, an interlayer insulating film 45 is formed on the entire surface of the silicon substrate 31, and contact holes 46 are formed. A metal film is formed on the interlayer insulating film 45 and patterned, thereby to form metal wiring 47.

As explained above, in the second embodiment, having formed the side wall protection films 39n and 39p, the gate oxide films 36n and 36p are protected from the release agent when to remove the photoresist films 40 and 42. Accordingly, both in the nMOS transistor area 50n and the pMOS transistor area 50p, the gate oxide films 36n and 36p can be obtained with high reliability.

In the above first and second embodiments, the mixture of NH$_4$OH and H$_2$O$_2$ is employed as the release agent for the photoresist films 14, 40 and 42 or as the cleaning agent for the silicon substrate 11, however, any other agent can be adapted.

In the above embodiments, in order to form the n$^-$-type diffusion layers 23 and 41 and the n$^+$-type diffusion layers 25, the ion implantation process of implanting As is performed. However, the impurities to be implanted are not limited to As (arsenic). Similarly, the impurities to be implanted when to form the p$^+$-type diffusion layers 43 are not limited to B. The impurities may be implanted at right angles to the silicon substrate or at any angles other than right angles to the silicon substrate.

In the above first and second embodiments, Co has been used for siliciding the surface of the silicon substrate 11. However, it is not limited to Co, and any other elements, for example, Ti (titanium) can be employed.

The semiconductor device of the present invention and the method of manufacturing the same are not limited to the above-described embodiments.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-185245 filed on Jun. 30, 1999, and including specification, claims, drawings and summary. The disclosure of the above Japanese Patent Application is incorporated herein by reference in its entirety.

What is claimed is:

1. A method of manufacturing a semiconductor device, comprising:

forming a first oxide insulating film on a semiconductor substrate;

forming a conductive film on said first oxide insulating film;

forming an etching mask with a predetermined pattern on said conductive film;

etching said conductive film using said etching mask, so as to form a gate electrode;

removing said etching mask with a removing agent;

forming a second oxide insulating film, with which a constriction formed in said first oxide insulating film by said removing agent is filled and which is incorporated with said first oxide insulating film, on a circumference of said gate electrode;

forming a gate insulating film which insulates between said gate electrode and said semiconductor substrate, by removing said first oxide insulating film using said gate electrode and said second oxide insulating film as masks;

forming a nitride protection film which covers at least a circumference of said gate insulating film, in order to protect said gate insulating film during a step following this step; and implanting an impurity into said semiconductor substrate using said gate electrode, said second oxide insulating film and said nitride protection film as masks, and forming a source area and a drain area by performing heat treatment.

2. The method of manufacturing a semiconductor device according to claim 1, wherein:

said forming said gate insulating film includes removing said first oxide insulating film and a part of said second oxide insulating film which corresponds to an upper surface of said gate electrode; and said forming said nitride protection film includes forming said nitride protection film as to cover said first and second oxide insulating films, and said method comprising:

removing a part of said nitride protection film which corresponds to the upper surface of said gate electrode, thereby to expose the upper surface of said gate electrode; and forming a silicide layer on the upper surface of said gate electrode.

3. The method of manufacturing a semiconductor device according to claim 1, wherein:

said semiconductor substrate is a silicon substrate;

said first oxide insulating film and said second oxide insulating film are thermal oxide films;

said conductive film is a polysilicon film;

said etching mask is a photoresist pattern;

said removing agent is a removing agent for photoresist, by which agent said thermal oxide film is unwantedly etched; and said nitride protection film is a nitride film which is hardly removed by said removing agent for photoresist, as compared to said thermal oxide film.

4. The method of manufacturing a semiconductor device according to claim 3, wherein said removing agent for photoresist is a mixture of $NH_4OH$ and $H_2O_2$.

5. The method of manufacturing a semiconductor device according to claim 1, comprising forming said second oxide insulating film to a thickness of 2.0 to 7.0 nm.

6. The method of manufacturing a semiconductor device according to claim 1, comprising forming said nitride protection film to a thickness of 3.0 to 8.0 nm.

7. A method of manufacturing a semiconductor device, comprising:

forming a first insulating film on a semiconductor substrate;

forming a conductive film on said first insulating film;

forming an etching mask with a predetermined pattern on said conductive film;

etching said conductive film using said etching mask, so as to form a gate electrode;

removing said etching mask with a removing agent;

forming a second insulating film, with which a constriction formed in said first insulating film by said removing agent is filled and which is incorporated with said first insulating film, on a circumference of said gate electrode;

forming a gate insulating film which insulates between said gate electrode and said semiconductor substrate, by removing said first insulating film using said gate electrode and said second insulating film as masks;

forming a protection film which covers at least a circumference of said gate insulating film, in order to protect said gate insulating film during a step following this step;

implanting an impurity into said semiconductor substrate using said gate electrode, said second insulating film and said protection film as masks, and forming a source area and a drain area by performing heat treatment;

forming a first diffusion area by implanting an impurity into the semiconductor substrate at a first concentration and a first energy level, through utilization of said gate electrode, said second insulating film and said protection film as masks;

cleaning said semiconductor substrate using a cleaning agent, while protecting said second insulating film with said protection film;

forming a side wall film on said protection film;

implanting an impurity into said semiconductor substrate at a second concentration which is higher than the first concentration and at a second energy level higher than the first energy level, through utilization of said gate electrode, said second insulating film, said protection film and said side wall film as masks, thereby to form a second diffusion area at a high concentration which area overlaps with said first diffusion area, and which is formed in a deeper position than a position of said first diffusion area; and diffusing and activating an impurity inside said first and second diffusion area by heat treating said semiconductor substrate, and forming a source area and a drain area each of which includes a low concentration area reaching a lower end of said gate electrode and a high concentration area connected to said lower concentration area.

8. A method of manufacturing a semiconductor device, comprising:

forming a well area of an opposite conductivity type to a conductivity type of a semiconductor substrate on a surface of said semiconductor substrate;

forming a first and second gate insulating films respectively on the surface of said semiconductor substrate and a surface of said well area;

forming a first gate electrode on said semiconductor substrate via said first insulating film, and a second gate electrode on said well area via said second gate insulating film;

forming a first and second protection films which respectively covers at least circumferences of said first and second gate insulating films;

forming a first diffusion area, by covering said well area with a first mask and implanting a first impurity into said semiconductor substrate through utilization of said first mask, said first gate electrode and said first protection film as masks;

removing said first mask with a removing agent while protecting said first and second gate insulating films respectively with said first and second protection films;

forming a second diffusion area, by covering said semiconductor substrate with a second mask and implanting a second impurity into said well area through utilization of said second mask, said second gate electrode and said second protection film as masks;

removing said second mask with a removing agent, while protecting said first and second gate insulating films respectively with said first and second protection films; and diffusing and activating an impurity inside said first and second diffusion areas by heat treating said semiconductor substrate, forming a first and second drain areas each including said first diffusion area reaching a lower end of said first gate electrode, and forming a second source and drain areas each including said second diffusion area reaching a lower end of said second gate electrode.

* * * * *